US006368678B1

(12) United States Patent
Bluck et al.

(10) Patent No.: US 6,368,678 B1
(45) Date of Patent: Apr. 9, 2002

(54) PLASMA PROCESSING SYSTEM AND METHOD

(76) Inventors: Terry Bluck, 3128 Butte St., Santa Clara, CA (US) 95051; James H. Rogers, 211 Images Cir., Milpitas, CA (US) 95035

( * ) Notice: Subject to any disclaimer, the term of this patent is extended or adjusted under 35 U.S.C. 154(b) by 0 days.

(21) Appl. No.: 09/495,548

(22) Filed: Feb. 1, 2000

Related U.S. Application Data (63) Continuation-in-part of application No. 09/235,943, filed on Jan. 22, 1999, now Pat. No. 6,101,972, which is a continuation-in-part of application No. 09/076,971, filed on Aug. 7, 1998, now Pat. No. 6,203,862.

(51) Int. Cl.$^7$ ................................................ H05H 1/24
(52) U.S. Cl. ...................... 427/569; 427/571; 427/577; 118/723 MP; 118/723 HC; 118/723 E
(58) Field of Search ...................... 118/723 MP, 723 E, 118/723 HC; 427/569, 571, 577

(56) References Cited

U.S. PATENT DOCUMENTS

| | | |
|---|---|---|
| 4,183,797 A | 1/1980 | Kennedy et al. |
| 4,500,507 A | 2/1985 | Boys et al. |
| 4,862,032 A | 8/1989 | Kaufman et al. |
| 5,124,179 A | 6/1992 | Garg et al. |
| 5,147,687 A | 9/1992 | Garg et al. |
| 5,160,544 A | 11/1992 | Garg et al. |
| 5,186,973 A | 2/1993 | Garg et al. |
| 5,292,370 A | 3/1994 | Tsai et al. |
| 5,427,668 A | 6/1995 | Sato et al. |
| 5,487,785 A | 1/1996 | Horiike et al. |
| 5,508,368 A | 4/1996 | Knapp et al. |
| 5,558,751 A | 9/1996 | Mahler et al. |
| 5,616,179 A | 4/1997 | Baldwin et al. |
| 5,635,245 A | 6/1997 | Kimock et al. |
| 5,637,353 A | 6/1997 | Kimock et al. |
| 5,643,423 A | 7/1997 | Kimock et al. |
| 5,674,638 A | 10/1997 | Grill et al. |
| 5,679,413 A | 10/1997 | Petrmichi et al. |

FOREIGN PATENT DOCUMENTS

| | | |
|---|---|---|
| WO | WO 98/10115 | 3/1998 |
| WO | WO 99/01277 | 1/1999 |

OTHER PUBLICATIONS

Deposition of Diamond by Hot Filament and DC–Plasma Co–Enhancement CVD by Fujimori et al. appeared in Electrochem Soc. Proc., vol. PV 89–12, p. 465 (1989).

Preparation and Properties of Highly Tetrahedral Hydrogenated Amorphous Carbon by Weiler et al. appeared in 1996 American Physical Society, Jan. 15, 1996–1; p. 1594.

The Growth of Diamond Films Using DC–Biased Hot Filament Technique by LI et al. appeared in the Proceeding of the 2nd Intl. Conf. Washington, D.C. Sep. 23–27, 1990 of New Diamond Science & Technology 1991.

Bias–Controlled Chemical Vapor Deposition of Diamond Thin Films by Lee et al.; Appl Phys Lett. 56(7) Feb. 12, 1990.

*Primary Examiner*—Thi Dang
(74) *Attorney, Agent, or Firm*—Stanley Z. Cole; Edward Berkowitz (57) ABSTRACT

A substrate processing system includes a processing chamber, an electrically floating substrate holder positioned in the chamber, a gas source for supplying a process gas to the chamber, at least one ion source located in the chamber, and a power source for energizing the ion source by positively biasing the anode and negatively biasing the cathode in a train of pulses of selectably variable duty cycle and magnitude to maintain a selected time averaged current, the bias in each instance being relative to the chamber. The ion source ionizes the process gas producing ions for processing a substrate disposed on the floating substrate holder in the chamber. The floating substrate is biased in accord with the net charge thereon as controlled by the energetic electron flux. One embodiment includes two such ion sources. In this case, the power source energizes the first and second anodes and the cathodes in a time multiplexed manner, such that only one of the first or second ion sources is energized at any time and interactions between ion sources are eliminated.

38 Claims, 6 Drawing Sheets

PLASMA PROCESSING SYSTEM AND METHOD

This invention is a continuation in part of a application Ser. No. 09/235,943, filed Jan. 22, 1999 now U.S. Pat. No. 6,101,972 which is a continuation in part of a application filed Aug. 7, 1998, entitled Processing System with Dual Ion Source, Ser. No. 09/076,971, now U.S. Pat. No. 6,203,862 both of which co-pending applications are incorporated herein by reference.

FIELD OF THE INVENTION

This invention relates to systems and methods for processing electrically floating substrates, either single sided or two-sided, using plasmas created through generated ions and, more particularly, to processing systems and methods for controlled treatment of substrate surfaces.

BACKGROUND OF THE INVENTION

Commercial plasma sources are used for both controlled deposition onto and etching from surfaces for a wide variety of industrial applications, especially semiconductor, optical, and magnetic thin film processing. The plasma formed by such sources generates reactive neutral and ionic species which can chemically and/or physically interact with surfaces to deposit or remove material.

In many processes, the use of energetic ions from plasma sources can result in the deposition of materials with unique properties or allow the etching of surfaces under conditions which would not otherwise be effective. A method for processing substrates in a plasma generally includes an ion source mounted in a vacuum chamber in which the substrate is present. A gas with specific chemical properties is supplied to the ion source for ionization. The plasma generated is a mixture of selected reactive neutral and ionic chemical species as well as energetic electrons. The energy of the ionic species interacting with the surface depends upon plasma electrical properties, the electrical potential of the substrate and chamber pressure. In the prior art, the energy of ions bombarding the substrate is controlled by means of the bias applied to the substrate. In the present work there is disclosed an alternative wherein the substrate is electrically floating and acquires a net charge thereby establishing the potential of the substrate. The ion energy is determined by the difference between the plasma potential and the potential at the surface of the substrate for which there is zero net current. The floating potential of the substrate is controlled in accord with the present invention.

For a wide variety of plasma based processes a critical parameter for the treatment of a substrate is the kinetic energy of the ion(s) intercepting the substrate. The ion kinetic energy is a probabilistic function of several variables characterizing the plasma, such as the pressure, temperature, the specific plasma gas, ion source parameters and the like. The potential of the substrate is a major contributing variable to the kinetic energy. For the case of a conducting substrate, this potential may be controlled by direct connection to an appropriate power source, as commonly practiced in the prior art. In the extreme case of a dielectric substrate, such a procedure can not produce a uniform constant potential over the surface of the substrate. As described herein, the present invention is directed to any situation wherein direct coupling to a power source will not suffice to control the substrate potential or such electrical coupling to the substrate is otherwise undesirable. The present invention is not limited to a perfect dielectric substrate, nor is it limited to the specific processes which are disclosed herein as exemplary exploitation of the invention In some applications, it is desirable to process both sides of a substrate simultaneously. This is typical in the deposition of thin layers of various materials in the manufacture of magnetic hard disks used in magnetic memory systems. In this case, ion sources are positioned on opposite sides of the disk. However, ion sources which utilize an anode for establishing a plasma potential tend to exhibit plasma instability and oscillation when two such sources are operated simultaneously in a processing chamber. Such unstable behavior does not permit predictable ion generation and process stability. Prior co-pending application Ser. No. 076, 971 addressed this problem by a time division multiplex of depositions by the respective ion sources thereby obtaining symmetrical coatings of the respective surfaces of the substrate. Also, it has proven difficult to coat thin films to the specifications satisfying the requirements of a protective film on a hard disk, for example, for computer data storage applications. Thinner coatings permit the head to fly closer to the magnetic domains at the surface of the disk as to permit an increase in Arial density of recorded information. In depositing overcoatings of the magnetic surface, the coating should have sufficient hardness, density, and adhesion as well as practical qualities in the finished disk, including high deposition rates and low numbers of resulting macroscopic particles on the surface. Accordingly, there is a need for improved substrate processing systems and methods wherein ion sources may operate in a stable manner in a processing chamber and wherein the properties of the deposited layers may be improved for their intended purpose.

Co-pending applications referenced above, taught the advantage accruing from differential biasing of substrate and chamber walls whereby the deposits on the chamber walls were characterized by low internal stresses resulting from a lower ion energy whereas the thin film material concurrently deposited on the substrate possessed desirable characteristics of hardness, density and adhesion resulting from deposits from ions of higher kinetic energy relative to the substrate.

These same practical requirements noted above are appropriate to optical as well as magnetic media. For example if a protective coating is desired for an optical substrate, uses of the disk require that coatings that are deposited be deposited with the desired hardness, density and adhesion at a high rate while extremely thin and that variations through the presence of varying particles be minimized.

SUMMARY OF THE INVENTION

According to a first aspect of the invention, a novel substrate processing system is provided. The substrate processing system comprises a processing chamber, an electrically floating substrate holder positioned in the chamber, a gas source for supplying a process gas to the processing chamber, at least one ion source located in the processing chamber and a power source for applying various voltages to the ion source or sources (in the event more than one source is present), and to also energize other surfaces of the chamber and a controller for regulating the duty cycle of the time dependent electron source portion of each ion source. Each ion source ionizes the process gas to produce ions for processing a substrate disposed on the substrate holder. Each ion source has a cathode and an anode. Each ion source also produces sufficient electron flux of appropriate energy distribution to produce a net negative charge accumulation on the substrate in the presence of an active plasma, to further lower the substrate potential. The power source energizes the one or more cathodes of the ion source or sources as well as the one or more anodes. In the event that more than one ion source is being used, the power source energizes the ion sources in a time multiplexed manner such that only one of the ion sources is energized at any time.

The controller senses chamber pressure through a pressure sensor and also monitors such electrical parameters as electron source emission current and anode and cathode potentials (of each ion source). By controlling these parameters, a desired substrate potential can be maintained.

The energy and density of electrons emitted by the cathode determine the net charge accumulation on the substrate, thereby controlling the substrate potential. The energy spectra of the electrons emitted by the cathode is controlled by the voltage difference between the anode and cathode, while the density of electrons emitted by the cathode is determined by the emission current (rate of electrons leaving the cathode) and the transport of electrons to the wall. In order to obtain a significant range of substrate potentials, some form of electron confinement is required, either with the use of magnetic fields (such as multipole fields) or electrostatic fields (cathode potential equal to or greater than wall potential). A different embodiment of the invention could use RF waves to produce the plasma and heat the electrons. The present invention employs a floating substrate and utilizes values of cathode and anode potentials and low enough gas pressure to assure that a portion of the electrons emitted from the electron source portion of the ion source will have sufficient kinetic energy the negative charge accumulation on the substrate causes the substrate potential to acquire a desired negative potential.

Biasing of elements of an ion source and/or the effective substrate potential as achieved herein, may also be used in accordance with this invention to selectively control the energy of the ions from the ion source that reach and interact with particular surfaces. For example, adjusting the potential of the substrate or by biasing the elements of the ion source one can concurrently create higher energy ions for deposition at the substrate and lower the energy of ions which deposit on the chamber walls. Thus, this invention enables a predetermined control of the condition of deposition at a surface and permits selectivity as to properties of the film deposited in accordance with ion energies.

In particular, when forming thin films of diamond like carbon (DLC) from a plasma containing a hydrocarbon gas such as ethylene, carbon deposited with low energy ions (<100 eV) on the walls of the processing chamber will exhibit much lower stress than carbon formed on the substrate with more energetic ions (180–200 eV). As the carbon deposits on the wall builds up, the lower stress will make it less likely to flake, and lower levels of small particles will be present on the surface of the substrate being coated. Although in this example the layer deposited on the substrate may exhibit higher stress then the deposited carbon on the wall, this is not a problem for the system because the deposited layer is so thin and the hard deposited surface acts as a most effective protective coating for the layers below.

Where the substrate is an insulating material, the prior art employed the selectable energy of an ion beam. See Kimock, et al, Datatech, $2^{nd}$ Edition, Spring 1999 Edition, pp. 69–77 (Published by ICG Publishing Ltd., 14 Greville Street, London EC1N 8SB). Typical prior art deposition apparatus employs biased grid structures to accelerate the ions. Such grid structures are essentially formed of a conductor defining an array of apertures through which ions accelerate from the plasma. Such apertures are limited in dimension to a few Debye lengths (a measure of the length to which an electric field extends into a plasma), thereby limiting the plasma density. The ion current produced is space charge limited. As a result, the deposition rate is rather low and throughput for the process is correspondingly low. It is also well known for the plasma at high potential to be isolated by spatial localization with magnetic fields. Such an arrangement requires a significant increase in the dimensions of the processing chamber to accommodate a transition region and a low background neutral pressure to avoid ion collisions over this transition region.

The present invention employs an electron flux to charge the electrically floating substrate (whether or not a dielectric material) to control the potential of the substrate with respect to operative potentials of the surrounding plasma, chamber walls and the like. The electron source for this non-contact biasing is modulated to produce the desired substrate potential during deposition (or other process) pulses.

Although the electron source may take different forms, a hollow cathode embodiment is preferred to provide both plasma excitation and substrate biasing during respective intervals of an operating cycle. The stability and control of the hollow cathode source is effected in regulation of the cathode duty cycle for a relatively high frequency modulation of the hollow cathode source relative to lower frequency modulation of anode pulses where plural plasma sources are employed. This modulation is applied at a high frequency relative to the anode pulse to produce a cathode duty cycle variation on the electron current output from the cathode. It is to be understood that reference to "cathode duty cycle" throughout this work means the fraction of time that the cathode is biased "ON", allowing electrons to be emitted by the cathode, while any anode is "ON".

Figure 2:
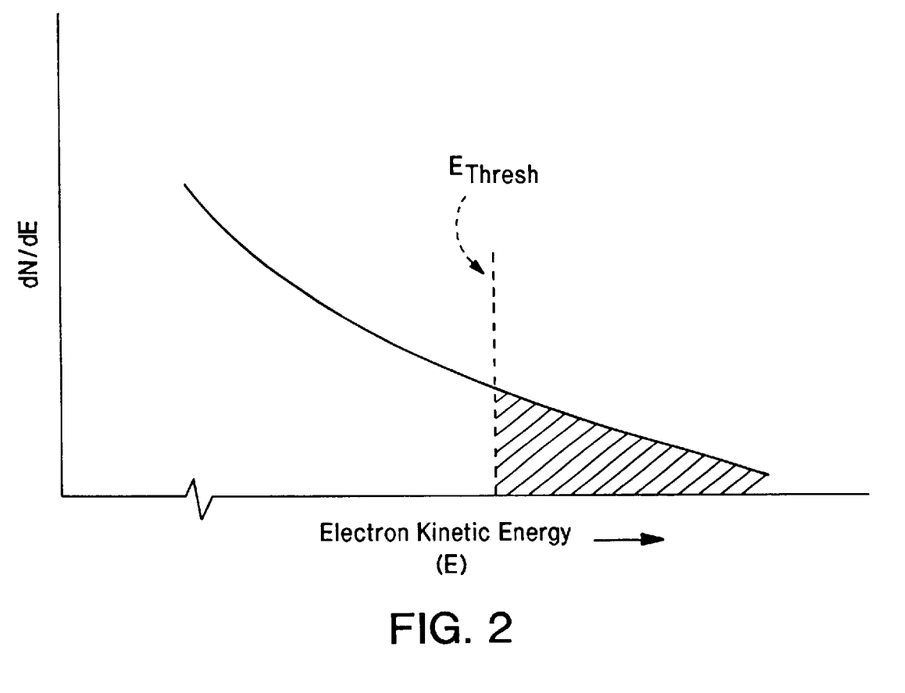
FIG. 2 represents a schematic illustration of the electron energy distribution.

The present invention recognizes that the potential of the substrate is directly affected by the net accumulation of electrical charge thereon. In a preferred embodiment for the present application, it is desired to achieve and maintain a preselected negative potential for the substrate relative to ground (the chamber walls) but intermediate such grounded walls and the more negative potential of the ion source cathode. This is obtained in the present invention, in part, with a judicious choice of the maximum kinetic energy of the electron flux. The electrons emitted from the cathode (of a typical source) exhibit a relatively broad spectrum as schematically illustrated in FIG. 2, showing the high energy tail portion of the electron energy distribution produced by the cathode electron source. Electrons having kinetic energy less than a threshold $V_{thresh}=e(V_{plasma}-V_{floating})$, where e=the charge on the electron, will be repelled by the substrate surface. The quantity $V_{thresh}$ is principally a function of the nature of the plasma and the gas pressure. Electrons of kinetic energy greater than the threshold transfer some kinetic energy to potential energy, but these electrons have sufficient energy to reach and intercept the substrate. Thus, these higher energy electrons contribute to charge the substrate to net negative potential in equilibrium with the positive ions bombarding the substrate from the plasma so that there is net zero electrical current to the substrate. The shape of the distribution and the value of the threshold determine the equilibrium potential of the substrate. Regulation of the deposition rate is achieved by controlling the time average number of ions which reach the substrate by controlling the time average electron emission current.

One desideratum of the present invention is an efficient and controllable electron flux. A preferred embodiment is one wherein the electron flux is spatially uniform in a desired direction and the predominant direction of electron emission from the cathode is directed toward the substrate rather than emission into 4π steradian and wherein the electron energy distribution is characterized by a reliably known shape providing a reasonable fraction of high energy electrons. The hollow cathode ion source answers these requirements.

The plasma density is enhanced by placement of a number of discrete permanent magnets along the chamber walls with the magnetic axis transverse to the axis defined by the centroid of the cathode and the center of the substrate. The adjacent magnets are thus disposed azimuthally about the chamber with alternating polarity to produce a greater and more uniform plasma density due to the resulting multipole magnetic field. These magnetic fields also enhance the confinement of the energetic electrons, thereby increasing the density of energetic electrons, which increases the difference in potential between the plasma and substrate.

Thus, prescribed plasma based processes which depend upon a controlled substrate potential are implemented in a novel manner. In particular, thin layers of DLC coatings can be deposited as protective coatings on one or both sides of magnetic, dielectric or other media (optical for example) with superior results compared to sputtered carbon films. In this instance the deposited layers, deposit as hard protective layers with sufficiently low numbers of small particles to minimize disk rejections in the manufacturing process resulting from glide or certification yield tests typically used by manufacturers to determine whether satisfactory and merchantable disks have been made. In the event that a disk fails to pass such tests the manufacturer may be obliged to discard the disks reducing output and profitability. The current invention considerably reduces these problems.

BRIEF DESCRIPTION OF THE DRAWINGS

For a better understanding of the present invention, reference is made to the accompanying drawings, which are incorporated herein by reference and in which.

DETAILED DESCRIPTION OF THE INVENTION

The invention is described below in the context of an application for symmetrically depositing DLC overcoating on opposite surfaces of a planar substrate. This application has been disclosed in the aforementioned co-pending applications. The application is representative of other plasma processes and geometries wherein the potential of the workpiece is established pursuant to the present invention, without physical contact of the workpiece to a power source for that purpose.

Figure 1:
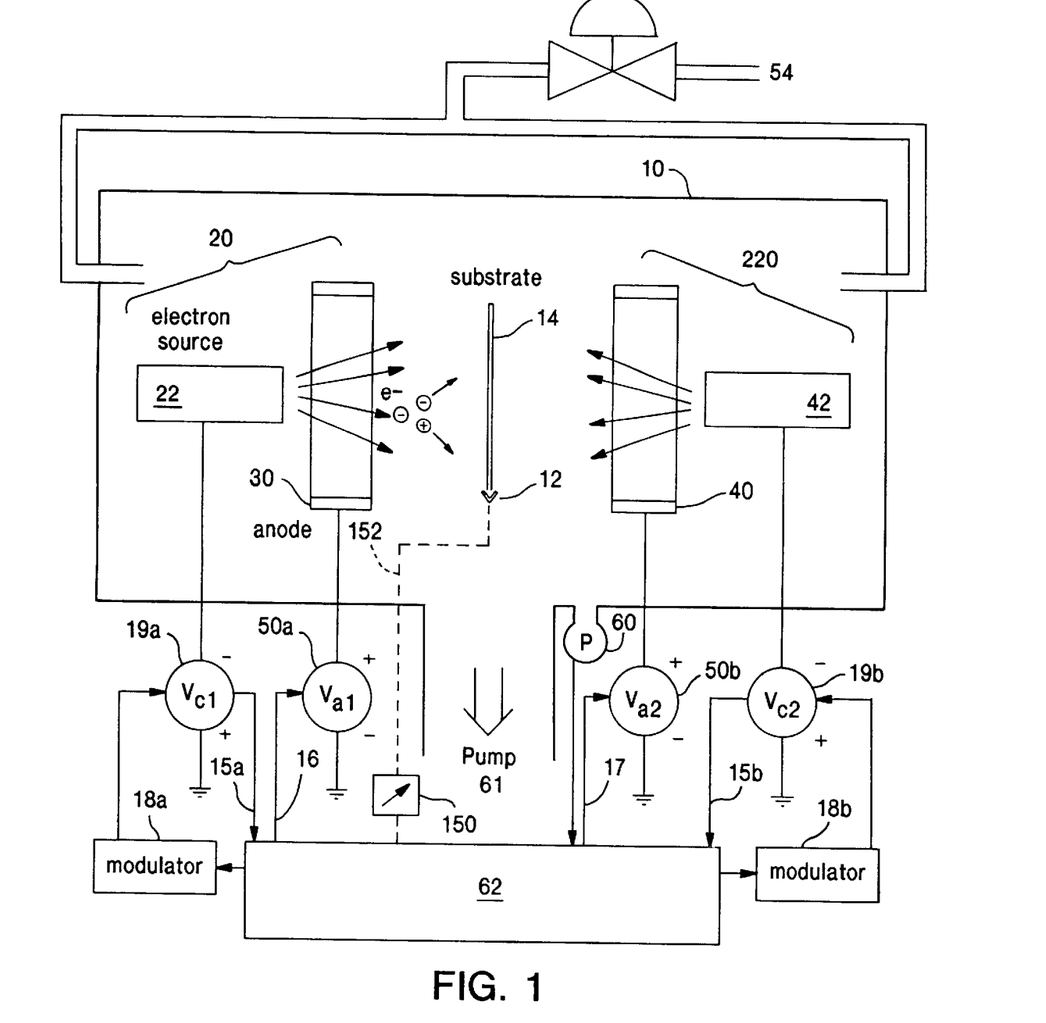
FIG. 1 is a schematic drawing of a dual deposition system in accordance with this invention

Turning now to FIG. 1, ion source 20 includes an anode 30 and an electron source 22. There is connected to the electron source 22, an electron source bias supply 19a. Ion source 220 includes an anode 40 and electron source 42 positioned near anode 40 and electron source bias supply 19b connected to electron source 42. Depending upon the choice of electron source, electron source power supplies, not shown, may be required to excite generation of electrons by filament heaters in a hot filament electron source, or to rapidly initiate cold cathode discharge of a hollow cathode electron source within the respective ion sources 20 and 220. Electron sources 22 and 42 function as cathodes for the ion sources. Although hollow cathode sources are preferred for practice of the invention as further described below, other embodiments may employ hot Tungsten filaments, photoelectron or like electron emission apparatus, or use of RF fields to accelerate electrons. Anodes 30 and 40 are connected to a power sources 50a and 50b including anode modulators (not shown) communicating through outputs 16 and 17 so that the respective ion sources 220 and 20 may be energized as described below. Also connected to the electron sources 22 and 42 are cathode modulators 19a and 19b.

A gas source 54 supplies a process gas or gas mixture to processing chamber 10. In particular, gas source 54 may supply gas to each of the ion sources 20 and 220 in the regions between anodes 30 and 40 and the substrate 14. Examples of suitable process gases include, but are not limited to, ethylene, methane and acetylene for the deposition of diamond-like carbon, mixtures of silane and ammonia for the deposition of silicon nitride, and argon, oxygen, or hydrogen for etching.

Gas is evacuated from chamber 10 by a vacuum pump 60 connected to the chamber. The gas source 54 and the vacuum pump 61 permit controlling the gas flow rate and the pressure in chamber 10, as discussed below in connection with specific processes such as the deposit of a DLC overcoating for magnetic media.

Chamber pressure sensor 60 provides a signal representative of chamber pressure to processor 62. It is understood that processor 62 represents the aggregation of control of the several variables and may be implemented with known microprocessor apparatus, or control of any of the several variables may be managed manually, or by other means.

The ability to select and maintain the substrate potential through the present invention is established in respect to apparatus of given geometry and a range of operating conditions. The net charge accumulated on a dielectric or other substrate 14 is established by a study of the substrate potential observed under controlled and measured conditions. For this calibration purpose, a conducting substrate is substituted in substrate holder 12 which in turn is, for this purpose, disposed in communication with a high impedance voltage measurement device 150. An oscilloscope equipped with a high impedance probe (of the order $10^7$ ohm) is a familiar example of a measurement apparatus resulting in negligible current drawn to ground. This substrate potential measurement is directed to calibration device 150 over communication path 152. In like manner, the electron emission current drawn from the power source(s) 50a and 50b is sensed and communicated to processor 62 via respective signals 15a and 15b. Bias voltages applied to the electron sources 22 and 42 and anodes 30 and 40 are sensed in like manner. Processor 62 originates a signal controlling cathode modulator 18a (and 18b) to direct a high frequency pulse train on the electron source 22 (and 42) to thereby control the time averaged electron flux directed toward substrate 14. For ranges of the observed variables and the selected cathode duty cycle, the measured potential of the test substrate taken from calibration device 150 is recorded and thus a tabular response function is obtained for the substrate potential. In subsequent operation with a floating workpiece, the process to be effectuated utilizes these data and prescribes a desired substrate potential. In relation to this desired substrate potential and the values of the observed variables of chamber pres-sure, electrical voltages applied to the electron source 22 (and 42), anode 30 (and 40) and respective electron emission currents, the processor 62 adjusts the cathode duty cycle to maintain (or vary in pre-selected manner) the desired time averaged electron flux. For the established operating conditions represented by the other variables, the cathode duty cycle determines the deposition rate by maintaining a programmed time average electron flux (constant time averaged plasma production).

In operation, each of the ion sources 20 and 220 ionizes the process gas to form ions of the process gas. The ions are directed toward substrate 14 for deposition or etching. When the ion sources 20 and 22 are energized, a plasma is formed in processing chamber 10. The electron sources 22 and 42 supply electrons for ionization of process gas molecules within the plasma. The ions are then accelerated across a plasma sheath at the substrate surface toward substrate 14. The processing system of FIG. 1 permits both sides of substrate 14 to be processed symmetrically, and substantially concurrently.

It is also possible to carry out this process by generating plasmas using other equipment and techniques. For example, an appropriate gas may be passed through an area where electromagnetic energy is used to accelerate electrons to create a plasma which can then be fed to and biased by the ion current control electrodes of the system.

Figure 3:
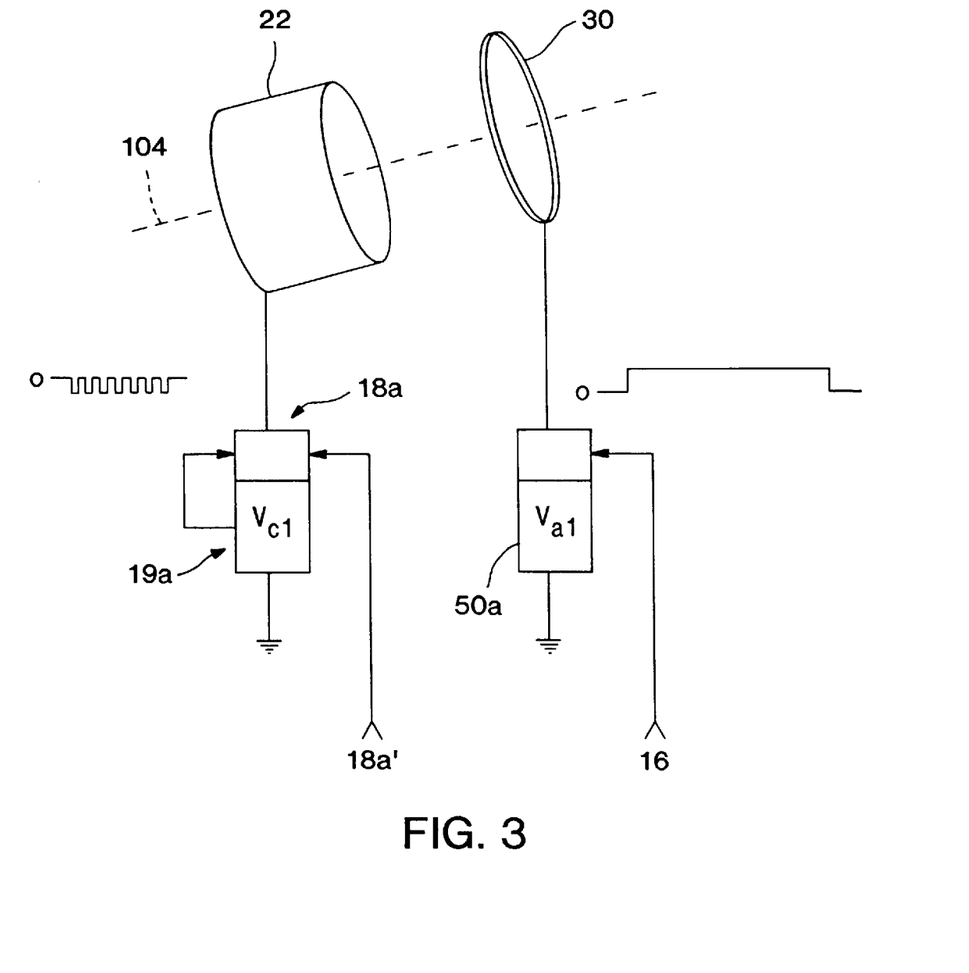
FIG. 3 represents a preferred embodiment of the hollow cathode ion source of the invention.

The preferred embodiment employs a hollow cathode source for the electron source. The hollow cathode source allows independent control of electron energy and average electron current within a region of high plasma density. FIG. 3 shows a typical hollow cathode electron source and an anode forming a suitable ion source structure. Such hollow cathode sources are well known.

As indicated above, instability and oscillation are observed when ion sources 20 and 220 are energized at the same time. The reason for such instability and oscillation is believed to be that the plasma within chamber 10 is a low impedance path for electrons generated by electron sources 22 and 42. Therefore, when both ion sources are energized, the first plasma to be established creates a path of low resistance for all electrons and conducts electrons away from the other plasma source. Even if both plasma sources are able to operate, the plasma impedances do not match, thereby creating unbalanced electron sharing and oscillations. During normal operation of sources using hot electron source electron sources, when a given anode is biased, all emitted electron current from the electron sources is collected by the one biased anode.

According to one aspect of the invention, ion sources 20 and 220 are energized in a synchronized, time multiplexed manner such that only one of the anodes is energized at any time. In particular, time multiplexed voltages may be applied to anodes 30 and 40 of the respective ion sources 20 and 220, such that the voltages applied to anodes 30 and 40 are non-overlapping in time. The alternation of the sources on and off times, thus eliminates the interactions of the plasma electrons and ions between sources. Electrons are collected by one anode and then the other alternately. The electron sources 22 and 42 may be excited concurrently without adverse effect and thus a greater maximum value may be reached in dynamic range for the time averaged electron flux for charging the substrate. Synchronized, or time multiplexed anode operation eliminates the need for complex shielding or grids to electrically isolate one plasma from the other.

The alternate excitation applied to anodes 30 and 40 through anode modulator line(s) 16 (and 17) preferably have frequencies less than about 100 kHz. In the preferred embodiment, the duty cycle for each anode is less than 50%, allowing short periods of time in which neither anode is energized in order to reduce the occurrence of arcing. Both cathodes are off when both anodes are off, and both cathodes are on when either anode is on. When a hollow cathode is used as an electron source, it is modulated a significantly higher frequency than the anode while either anode is on. In general, the frequencies of the anode voltages should be low in comparison with the time required for the plasma to come to equilibrium. This ensures that each ion source switches on and off rapidly in comparison with the on and off times of the anode voltages. In a preferred embodiment, the anode voltages have frequencies in a range of about 1 to 5 kHz. The voltage waveform applied to the anodes is preferably a square wave, but particular processes may benefit from another shape.

Figure 4:
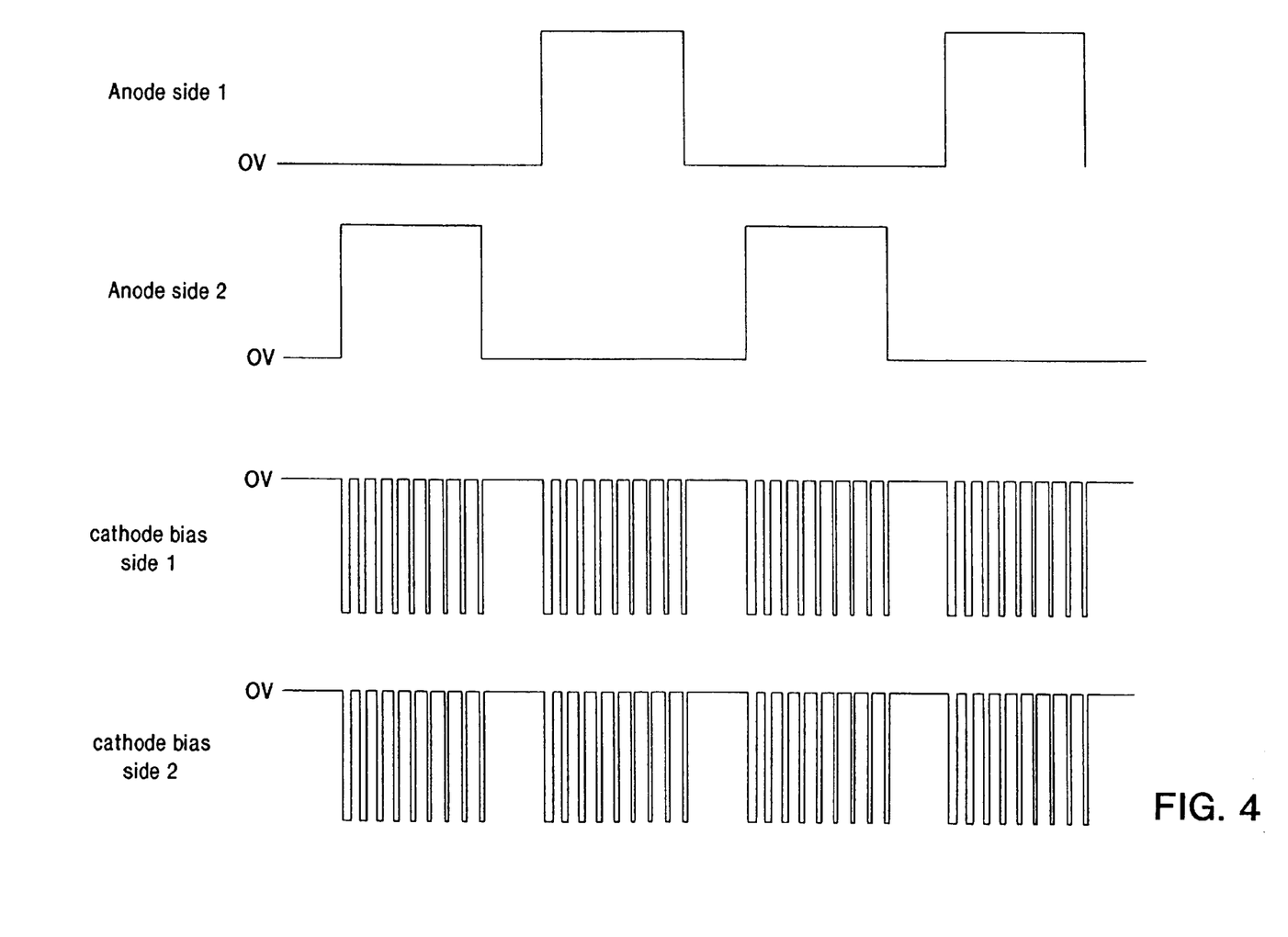
FIG.4 shows respective pulsed voltage waveforms imposed on the anodes and cathodes of a plural ion source plasma deposition system

At the time an anode is pulsed to a positive potential, the bias on the electron source(s) are also pulsed or biased, but in a negative direction as shown in FIG. 4, discussed below. In this way the voltage difference between the electron source and the anode is sufficient to create a plasma. In accord with the present invention, the substrate acquires a sufficient net negative charge, and associated negative surface potential, which accelerates ions from the plasma at a controlled kinetic energy. Thus, an extremely hard surface is created which can provide protective coatings notwithstanding that the films deposited may be very thin. Yet the walls of chamber 10 having been grounded throughout the time that other elements in the system have been pulsed causes softer material depositions because the kinetic energy of ions intercepting the walls is much lower because of the lower voltage difference.

For a processing chamber having two ion sources, the duty cycles of the anode voltages are preferably less than 50% and are preferably equal. Unequal duty cycles may be utilized but would result in unbalanced processing of the two sides of substrate 14. The anode voltages (and thus the negative bias to the cathode) preferably each has an anode duty cycle of about 30%, such that both ion sources 20 and 220 are off during a portion of each cycle of the anode voltages.

A suitable power source 50*a* (or 50*b*) would be known to one skilled in the art. Anode power supplies 50*a* and 50*b* may be derived from the same physical module. Sources are discussed and also shown in the co-pending applications cited above and such disclosure and discussion is incorporated herein by reference. A power source which is used to apply power to all elements in the system requires appropriate controls and switching capability to assure correct biasing of anodes, cathodes and modulation control in a proper time multiplexed fashion. Such elements to assemble such structures are known to the art.

In FIG. 4 the applied bias to the elements of a dual ion source processing system of this invention are illustrated over time. As shown in this figure, the top curve (a) illustrates the bias to the anode on side 1 of the substrate being coated. The graph (b) illustrates the bias to the anode facing the second or other side of the substrate. The graphs (c) and (d) respectively, illustrate the voltage applied to the electron sources such as electron sources 22 and 42 in FIG. 1. As illustrated a positive bias is applied to the anodes when energized. Thus, as shown, a positive voltage is first applied to the anode facing one side of the substrate or disk being coated. Simultaneously the electron sources, e.g., cathodes, are biased negatively in a train of pulses which impose a selected average electron flux from the electron source. These voltages, the electron source biases, the positive bias on the anode facing side two of the disk are then all brought to ground in order to avoid interaction between the ion sources. Thereafter, a positive voltage is applied to the anode facing the other side of the substrate or disk and a negative bias is applied to (preferably both) electron sources through cathode modulator 18a and 18b. All of these applied biases are also brought to ground during that portion of the cycle time that the ion sources are not energized. This cycle continues during the periods the anodes are being energized. In general the anode duty cycle for energizing each anode will comprise about 30 to 40 percent of the cycle time with the remaining 20 to 40 percent of the time during which the elements are all grounded. The cathode duty cycle, when the anode is activated, will vary to maintain the desired average electron emission current. The cathode duty cycle may be controlled by a feedback circuit or the duty cycle may vary dynamically in pre-selecfed manner during anode excitation as shown in the curves (c) and (d) of FIG. 4.

Figure 5:
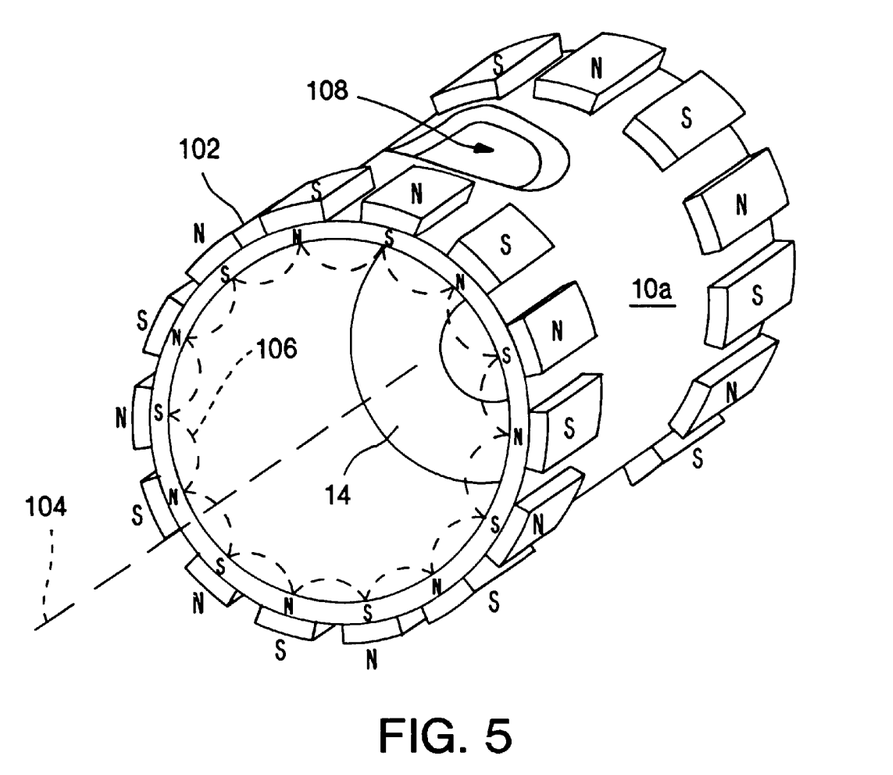
FIG. 5 is an arrangement for obtaining enhanced plasma density.

FIG. 5 shows an interior wall of a chamber body 10a with one possible configuration of discrete permanent magnets 102 which are placed within the chamber body. The magnetic axis of the magnets is radial with respect to the chamber axis 104, and neighboring magnets have their fields oriented in opposite directions, resulting in lines of magnetic flux represented by 106. The magnetic field strength is sufficient (greater than 1 kG at the wall) to provide some ion confinement as well as electron confinement. Providing ion confinement at the walls results in a more homogeneous plasma density in the core of the plasma and better uniformity of deposition on the substrate 14. Confinement of the energetic electrons provides a greater possible range of substrate bias relative to the plasma. Access to the chamber body 10a through port 108 provides for insertion and removal of substrates.

Figure 6A:
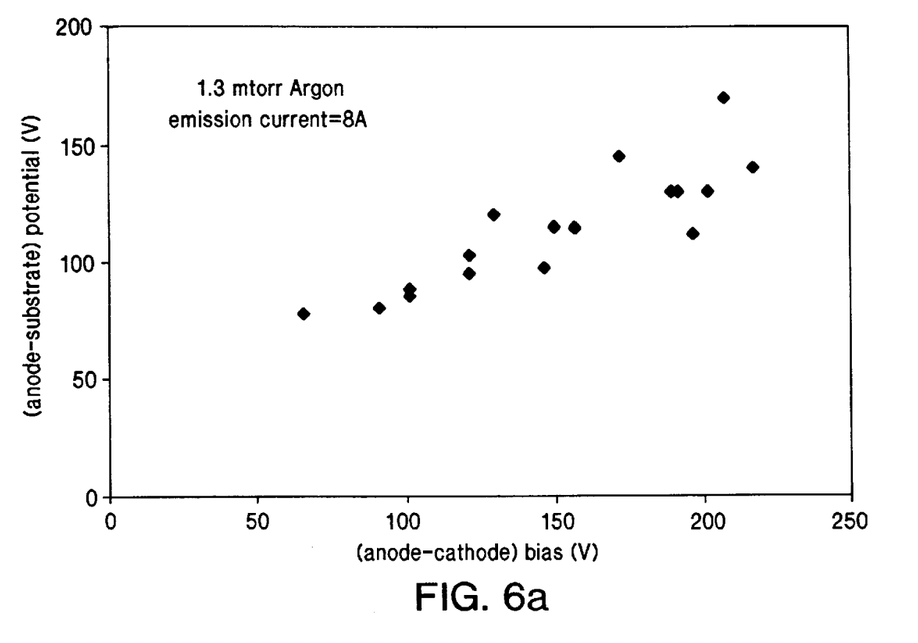
FIG. 6a is a measurement of substrate potential control for a first set of values for control parameters.

One example of the principle of energetic electrons biasing a substrate is shown in FIG. 6a. In this case, Argon gas is ionized using hot Tungsten filament cathodes in a chamber lined with permanent magnets used to form confining cusp fields.

The geometry of the permanent magnets used to confine the plasma is as illustrated in FIG. 5. Two sections of 24 magnets each (disposed at 15 degree intervals around the chamber) were used. The magnets were made from a NdFeB alloy with dimensions approximately 0.25"×0.75"×3" (magnetic axis parallel to the thickness) which resulted in a maximum field strength at the vacuum/wall interface of approximately 1.1 kG. Two additional 1" diameter magnets were placed on the axis of the chamber at each end (outside the vacuum) with the North poles facing into the chamber. The fields from these end magnets helped supply some axial confinement of the energetic electrons. The main vacuum chamber had an inner diameter of approximately 7.5" and length 9".

Figure 6B:
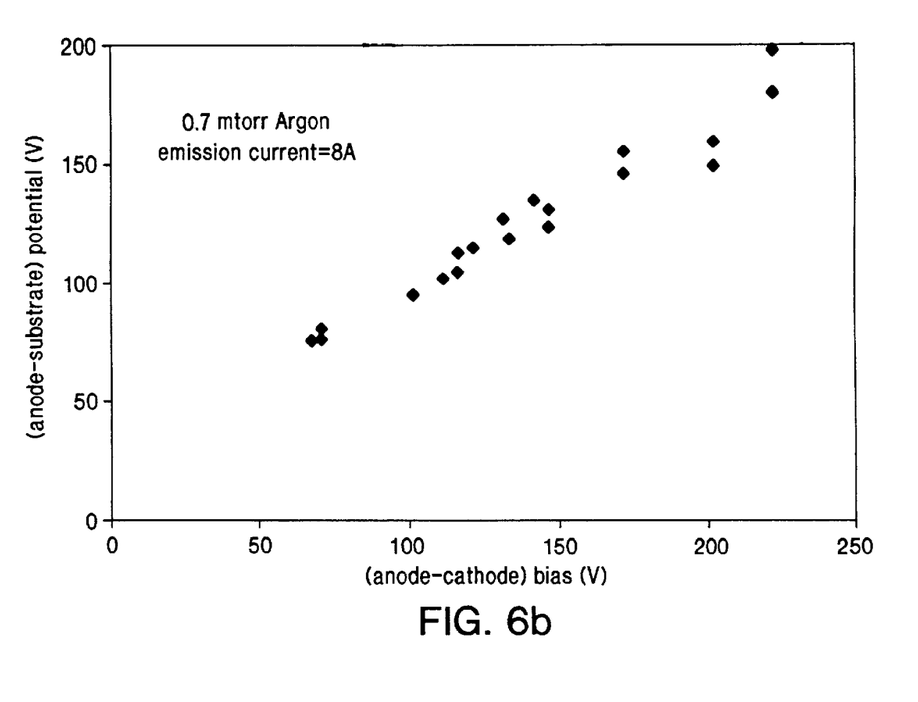
FIG. 6b is the same as FIG. 6a at a reduced pressure.

Anodes were biased at +60 volts to set the plasma potential to ~60 volts. The cathode bias was pulsed at a frequency of 51.5 kHz and a duty cycle of 38%. The peak emission current was approximately 8 Amps. If the bias is not pulsed, or pulsed at a low frequency, the substrate bias effect is observed to diminish. The reason for this time dependency is not fully understood, but may be due to the growth of plasma instabilities, such as the two stream instability, (see N. A. Krall and A. W. Trivelpiece, Principles of Plasma Physics, p. 449–476, San Francisco Press, Inc. (1986) which will increase the rate of thermalization of the energetic electrons. For the measurements represented in FIG. 6a,b, a high impedance oscilloscope probe was used to measure the potential of an Aluminum substrate which has no other electrical connections (i.e. essentially zero net current flowing to the substrate). The anode voltage, cathode bias voltage, and electron emission current were also measured with a 100 MS/s digital oscilloscope. Since the plasma potential is approximately equal to the anode voltage, the electrons are emitted with energy approximately equal to the anode voltage minus the cathode bias voltage (the x-axis of the graph). Also, the energy of ions impacting the substrate surface will be approximately equal to the anode voltage minus the substrate potential (the y-axis of the graph). FIG. 6a shows the relation of substrate bias versus electron energy at an Argon neutral pressure of 1.3 mtorr, while FIG. 6b shows the relation with a Argon neutral pressure equal to 0.7 mtorr. The higher pressure case shows some variation in substrate potential for a given anode and cathode bias voltage, presumably due to the higher rate of collisions. At lower pressure, a very linear relationship is achieved between the substrate potential and anode cathode bias voltage.

Shields or liners are known to the art and are used in the semiconductor field. In this invention the shield or liner is used to prevent deposits on the chamber walls and to simplify chamber clean up. Typically a liner may be used for a period of time such as about $10^2$ hours or even a longer period of time. It then can be easily removed from the chamber to clean the chamber. This is done rapidly and does not put the chamber out of use while a clean up of the walls takes place. Thus liners or shields are rapidly changed allowing the chamber to be pumped down without a long delay to clean the walls placing the system into operation more rapidly.

It has been found that preconditioning the chamber as through exposure of the chamber to a pure argon plasma for about an hour lowers the particle deposits on the surface of the substrate as disks are processed in the system. It is believed this type conditioning purifies the inside of the chamber or shield or liner being used in the chamber by removal of contaminants in the chamber or in liners associated with the chamber prior to operating the system to coat disks.

A processing system having one or two ion sources has been discussed thus far. The time multiplexed operation of dual ion sources as described in connection with FIG. 1 may be extended to a larger number of ion sources. In each case, the ion sources are energized such that only one ion source is on at any time. For example, a processing system having four ion sources may be energized with non-overlapping anode voltages having duty cycles of 25% or less. The anode voltages applied to two or more ion sources depend on the number of ion sources, the desired anode duty cycle, the desired operating frequency and the type of structure or surfaces being treated. In each case, interaction between ion sources can be eliminated and depending on the other voltages applied, selectivity in deposition and selectivity in material qualities may be pre-selected and predetermined A processing system of the present invention utilizing a single ion source is simply related to the multiple source systems discussed. In such an arrangement, the modulation of the anode is not required for the reasons discussed herein (although there may be some specific process requirement for anode modulation).

The voltage applied to the anodes can be varied from a low value determined by the minimum necessary to get significant ionization of the working gas (about 50 V), and a maximum determined by the onset of arcing on the grounded walls (typically >200 V difference between the anode voltage and the wall voltage). The number of particles on the surface of the substrate tends to increase with anode voltage and a greater difference of voltage between the anode and the wall, so the optimum anode voltage is generally the lowest voltage at which the required deposition rate, film properties, and reliable discharge onset can be obtained.

Controlling relative voltages allows control of the hardness and stress of the deposited film. This has particularly been found to be the case when depositing thin films of DLC simultaneously on both sides of the substrate. Further, we have found that for anode potential Va and substrate potential $V_s$, $V_a-V_s>120$ V produces very hard (>25 GPa) films with high stress (approx 3–4 Gpa); whereas, for $V_a-V_s$ of approximately 40 V, the films are much less hard (approximately 9 Gpa) with low stress (<0.5 Gpa).

The results of controlling the stresses in substrate and wall deposits through control of the differential ion energies incident on walls and substrate were disclosed in the above referenced co-pending applications.

Although the mechanisms of the instant invention are not fully understood, it is presently believed that a plasma is formed, biased positively in reference to the grounded walls, and ions are accelerated across a sheath at the interface between the plasma and the biased substrate, in the event that the substrate is biased. Using a plasma rather than, for example, an ion beam, allows much higher deposition rates than otherwise possible. In this connection we have achieved deposition of protective overcoating layers in accordance with this invention at rates equal to or in excess of 15 Angstroms per second.

An advantage of the biased plasma approach over a gridded ion beam source, a source that can be turned on and off, is that it is generally difficult to obtain high deposition rates at low ion energies because of space charge limits in acceleration grids. Also, the nature of the plasma sheath ensures that the ion acceleration is normal to the surface of the substrate over the entire surface area, whereas ion beams will exhibit some divergence from normal incidence away from the axis of the substrate.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A substrate processing system comprising:

a grounded processing chamber;

a substrate holder positioned in said processing chamber and electrically floating therein;

a gas source coupled to said processing chamber for supplying a process gas to said processing chamber;

an ion source in said chamber for ionizing said process gas to produce ions for processing a surface of a substrate disposed on said substrate holder facing said ion source, said ion source comprising an anode and an electron source;

a substrate charging electron source disposed to deliver a train of electron flux pulses to a substrate supported by said substrate holder at a selected energy and time averaged current comprising a cathode duty cycle, whereby said substrate is capable of sustaining a bias to a selected negative potential with respect to ground, and a power source for biasing said anode, said electron source of said ion source and said substrate charging electron source such that said anode is biased to a positive voltage, said electron source is biased to a negative potential at said cathode duty cycle, whereby said substrate on said substrate holder is biased to a potential intermediate said electron source and said processing chamber.

2. The substrate processing system of claim 1 wherein said substrate charging electron source and said electron source of said ion source are the same structure.

3. The substrate processing system of claim 1 wherein said electron source of said ion source comprises a hollow cathode.

4. The substrate processing system of claim 2 further including a controller comprising a pressure sensor responsive to the pressure of said process gas, and a current sensitive sensor responsive to the electron emission current of said substrate charging electron source.

5. The substrate processing system of claim 4 comprising a processor communicating with said pressure sensor, said current sensitive sensor for establishing the prevailing relationship of pressure, electron source potential and anode source potential and said electron emission current.

6. The substrate processing system of claim 5 wherein said processor comprises a memory for retaining calibrated relationships of said pressure, said electron source potential, said anode source potential and said time averaged electron flux which result in an observed potential sustained by said substrate and the value of a pre-selected potential setpoint.

7. The substrate processing system of claim 6 comprising logic means to compare prevailing values of said prevailing relationship to said calibrated relationships and generate a duty cycle signal representative of said selected duty cycle.

8. The substrate processing system of claim 7 comprising a modulator operative to produce said pulse train in response to said cathode duty cycle signal, whereby said modulator limits the electrical potential of said substrate by limiting the time average electron flux incident on said substrate in reference to said relationship.

9. A substrate processing system as defined in claim 1 wherein a second ion source comprising a second anode and a second electron source is positioned facing the opposite surface of a substrate on said substrate holder and wherein said power source is adapted to apply a time multiplexed voltage to each of the anode of said ion source and said second anode.

10. A substrate processing system as defined in claim 9 wherein said power source comprises means for applying a pulsed, periodic voltage to each of said anode of said ion source and said second anode at a frequency of less than about 100 kHz.

11. A substrate processing system as defined in claim 9 wherein said power source comprises means for applying a pulsed, periodic voltage to each of said anode of said ion source and said second anode at a frequency that is less than a reaction time of a plasma in said chamber.

12. A substrate processing system as defined in claim 9 wherein said power source comprises means for applying a pulsed, periodic voltage to each of said anode of said ion source and said second anode at a duty cycle less than or equal to about 40% and said electron sources are biased negatively during the time an anode is pulsed to a positive voltage.

13. A substrate processing system as defined in claim 9 wherein said power source includes means for applying a pulsed, periodic positive voltage to each of said anodes at anode duty cycle equal to or less than about 40%, wherein said ion source and said second ion source are both off during a portion of each cycle of the pulsed, periodic voltage.

14. A substrate processing system as defined in claim 1 wherein said gas source supplies $C_2H_4$ to said chamber.

15. A substrate processing system as defined in claim 9 wherein said gas source supplies ethylene and argon to said chamber.

16. A substrate processing system as defined in claim 9 wherein said power source comprises a power supply having a first and a second pulsed output, each said pulsed output coupled to said anode of said ion source and said second anode, respectively, wherein said first and second pulsed outputs comprise pulses that are phased shifted such that said anode of said ion source and said second anode are energized at different times and whereas said electron source of said ion source and said second electron source are energized at said cathode duty cycle when a pulsed output is applied to said electron source of said ion source and said second electron source.

17. A substrate processing system as defined in claim 9 wherein said processing gas is ethylene and the pressure in the chamber during the time gas is being fed into the chamber attains about 4 mtorr.

18. A substrate processing system as defined in claim 9 wherein said electron source of said ion source and second electron source each comprise a hollow cathode for generating electrons and a modulator for and applying a negative bias to said hollow cathode at said cathode duty cycle.

19. A substrate processing system as defined in claim 10 wherein said power source comprises means for applying a pulsed, periodic voltage to each of the anode of said ion source and said second anode at a frequency in the range of about 1 to 5 kHz.

20. A substrate processing system as defined in claim 9 wherein said ion source generates ions of said process gas for etching said substrate.

21. A substrate processing system as defined in claim 9 wherein said ion sources generate-ions of said process gas for etching said substrate.

22. A method for processing a substrate, comprising the steps of:
positioning a substrate in a processing chamber and maintaining said substrate as electrically floating; grounding said processing chamber;
supplying a process gas to the processing chamber; ionizing said process gas with an ion source located in said chamber facing a surface of the substrate to produce ions of said process gas for processing the surface of the substrate, said ion source comprising an anode and an electron source;
applying a positive bias to said anode while applying a negative bias to the electron source whereby an electron flux is extracted from said ion source, directing said electron flux toward said substrate; and interrupting said extracted electron flux at a selected interval, whereby said substrate experiences a selected energy and time averaged current comprising a cathode duty cycle and thereby acquires a net charge.

23. The method of claim 22 including supplying ethylene and argon gas as said process gas into said chamber.

24. The method of claim 22 wherein said substrate is exposed at its other surface to at least a second ion source comprising at least a second anode and at least a second electron source and energizing the first anode and said second anode by applying pulsed, periodic positive voltages comprising first and second anode duty cycles, respectively to each of the first and at least second anode and also applying a negative bias to the electron source at a first cathode duty cycle whereby a time averaged electron flux is extracted from said ion source toward said substrate; and applying a negative bias to said second electron source at a second cathode duty cycle whereby another time averaged electron flux is extracted from said second ion source and directing said another time averaged electron flux toward said other surface of said substrate,
said first cathode duty cycle and second cathode duty cycle each being smaller than said first anode duty cycle and said second anode duty cycle.

25. The method of claim 24 wherein the step of energizing the first anode and said second anode and their said electron sources comprises energizing the first anode and said second anode and said electron sources with first and second periodic voltages, respectively, that are out of phase.

26. The method of claim 25 wherein said first and second periodic voltages have duty cycles of less than about 40% and said first and second ion sources and the associated electron sources are both off during a portion of each cycle of the periodic voltages.

27. The method of claim 26 wherein said cathode duty cycle and said second cathode duty cycle are identical and in phase.

28. A method for operating two or more ion sources in a processing chamber, said two or more ion sources each having an anode and an electron source, comprising the step of:
energizing the anodes of said two or more ion sources in a time multiplexed manner such that only one of said two or more ion sources is energized at any time; and
exciting said electron sources with a negative bias pulse train of selected energy and time averaged current during that interval in which said anodes are energized.

29. A substrate processing system comprising:
a processing chamber;
an electrically floating substrate holder positioned in said processing chamber;
a gas for supplying a process gas to said processing chamber;
first and second anodes positioned in said processing chamber;
an electron source biased negatively in said chamber for producing electrons at a selected energy and time averaged current within said chamber for ionizing said process gas to produce ions for processing and electrically charging a substrate disposed on the substrate holder, and
a power source for energizing with a positive bias relative to the chamber said first and second anodes in a time multiplexed manner so that only one of said anodes is energized at any time, and said power source capable of furnishing a negative bias at said cathode duty cycle to said electron source.

30. A method in accordance with claim 22 including positioning ion sources on different sides of said substrate.

31. A method in accordance with claim 30 including feeding process gas to each side of said substrate.

32. A processing system to deposit diamond like carbon on the two surfaces of an electrically floating substrate at a processing station comprising:

a processing chamber;

a substrate holder positioned in said processing chamber and electrically floating;

a source of hydrocarbon gas coupled to said processing chamber to feed gas into said chamber;

a power source and first and second plasma generators, each said plasma generator comprising an anode and an electron source positioned on a surface side of a substrate on said substrate holder to generate a plasma thereat; said power source connected to said first and second plasma generators adapted to energize said plasma generators by applying a positive voltage to the anodes of said generators thereof in a time multiplexed manner such that only one of said anodes of said plasma generators is energized at any one time, said power source adapted to furnish a time dependent negative bias voltage of selected magnitude to said electron sources at a selectable interval; and selected negative voltage applied to said electron sources at said selectable interval while a positive voltage is applied to an anode of said plasma generators.

33. A substrate processing system comprising:

a processing chamber;

a substrate holder positioned in said processing chamber and electrically floating therein;

a gas source coupled to said processing chamber to supply process gases to said processing chamber;

a first plasma generator in said chamber connected to a power source for ionizing said process gas to produce ions for processing a substrate disposed on said substrate holder;

a second plasma generator in said chamber connected to a power source for ionizing said process gas to produce ions for processing a substrate disposed on said substrate holder; each of said plasma generators being disposed on opposite sides of the surfaces of a substrate on said substrate holder;

a power source for energizing in a time multiplexed manner such that only one of said generators is energized at any one time; and an electron source disposed to deposit negative charge on said substrate at a selected rate and at a selectable maximum electron energy.

34. A substrate processing system in accordance with claim 32 in which a liner is positioned within the chamber and protects the walls of the chamber from deposits.

35. A substrate processing system as defined in claim 1 or 9 wherein said ion source generates ions of said process gas for etching the deposits on the surface of a shield in said chamber.

36. The substrate processing system of claim 35 in which the process gas comprises Argon.

37. The substrate processing system of claim 35 wherein said sources define a chamber axis and a plurality of magnets are disposed in respect to said axis to produce a desired magnetic field within said chamber, said magnetic field increasing the density of ions proximate said chamber axis.

38. The processing system of claim 32 wherein said hydrocarbon gas is ethylene.

* * * * *